(12) United States Patent
Joo

(10) Patent No.: US 10,727,302 B2
(45) Date of Patent: Jul. 28, 2020

(54) SEMICONDUCTOR DEVICE AND METHOD MANUFACTURING THE SAME

(71) Applicants: HYUNDAI MOTOR COMPANY, Seoul (KR); KIA MOTORS CORPORATION, Seoul (KR)

(72) Inventor: Nack Yong Joo, Hanam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 15/988,558

(22) Filed: May 24, 2018

(65) Prior Publication Data

US 2019/0189752 A1      Jun. 20, 2019

(30) Foreign Application Priority Data

Dec. 14, 2017    (KR) .................. 10-2017-0172297

(51) Int. Cl.

| | |
|---|---|
| *H01L 29/10* | (2006.01) |
| *H01L 29/08* | (2006.01) |
| *H01L 29/66* | (2006.01) |
| *H01L 29/78* | (2006.01) |
| *H01L 29/423* | (2006.01) |
| *H01L 29/808* | (2006.01) |
| *H01L 29/16* | (2006.01) |

(52) U.S. Cl.
CPC ...... *H01L 29/1087* (2013.01); *H01L 29/0865* (2013.01); *H01L 29/0869* (2013.01); *H01L 29/4236* (2013.01); *H01L 29/66068* (2013.01); *H01L 29/66909* (2013.01); *H01L 29/7803* (2013.01); *H01L 29/7813* (2013.01); *H01L 29/7832* (2013.01); *H01L 29/8083* (2013.01); *H01L 29/1608* (2013.01)

(58) Field of Classification Search
CPC combination set(s) only.
See application file for complete search history.

(56) References Cited

U.S. PATENT DOCUMENTS

| | | | |
|---|---|---|---|
| 7,986,005 B2 | 7/2011 | Schilling et al. | |
| 2012/0019284 A1 | 1/2012 | Mauder et al. | |
| 2014/0159141 A1* | 6/2014 | Arthur | H01L 29/42368 257/329 |
| 2015/0179794 A1* | 6/2015 | Hong | H01L 29/66666 257/43 |
| 2018/0277437 A1* | 9/2018 | Yamada | H01L 29/1608 |

* cited by examiner

*Primary Examiner* — Moin M Rahman
(74) *Attorney, Agent, or Firm* — Morgan, Lewis & Bockius LLP

(57) ABSTRACT

A semiconductor device includes: an n− type layer disposed on a first surface of a substrate; an n+ type region disposed on the n− type layer; a trench disposed on the n− type layer; a p type region disposed adjacent to a side surface of the trench and extending to a part under a lower surface of the trench; an auxiliary n+ type region disposed under the lower surface of the trench and disposed in the p type region; an auxiliary electrode disposed at the lower surface of the trench; a gate electrode separated from the auxiliary electrode and disposed on the lower surface of the trench; a source electrode disposed on the n+ type region; and a drain electrode disposed at a second surface of the substrate.

8 Claims, 10 Drawing Sheets

SEMICONDUCTOR DEVICE AND METHOD MANUFACTURING THE SAME

CROSS-REFERENCE TO RELATED APPLICATION

This application claims priority to and the benefit of Korean Patent Application No. 10-2017-0172297 filed in the Korean Intellectual Property Office on Dec. 14, 2017, the entire content of which is incorporated herein by reference.

TECHNICAL FIELD

The present disclosure relates to a semiconductor device and a manufacturing method thereof.

BACKGROUND

A transistor device (a MOSFET, a JFET, a MESFET, an IGBT, etc.) is a three-terminal device for transmitting a current through a control of a gate terminal, particularly a power semiconductor transistor for a switching is required with a high breakdown voltage and a large current.

The transistor device has different electric characteristics depending on the structure, and an appropriate device is used depending on an application field. However, a high current density, a low turn-on voltage, a high breakdown voltage, a low leakage current, a fast switch speed are commonly required, and In order to simultaneously satisfy the above requirements, various structures have been proposed.

The above information disclosed in this Background section is only for enhancement of understanding of the background of the disclosure and therefore it may contain information that does not form the prior art that is already known in this country to a person of ordinary skill in the art.

SUMMARY

The present disclosure improves the current density of the semiconductor device and reduces leakage current of a gate electrode leakage current.

A semiconductor device according to an exemplary embodiment of the present disclosure includes: an n− type layer disposed on a first surface of a substrate; an n+ type region disposed on the n− type layer; a trench disposed on the n− type layer; a p type region disposed adjacent to a side surface of the trench and extending to a part under a lower surface of the trench; an auxiliary n+ type region disposed under the lower surface of the trench and disposed in the p type region; an auxiliary electrode disposed on the lower surface of the trench; a gate electrode separated from the auxiliary electrode and disposed on the lower surface of the trench; a source electrode disposed on the n+ type region; and a drain electrode disposed on a second surface of the substrate, wherein the auxiliary electrode is in contact with the auxiliary n+ type region, and the source electrode is in contact with the n+ type region.

The auxiliary electrode may be separated from the source electrode and the drain electrode.

The auxiliary electrode may be disposed in the side surface of the trench and is in contact with the p type region.

A gate insulating layer disposed between the gate electrode and the lower surface of the trench may be further included, and the gate insulating layer may be separated from the auxiliary electrode and is disposed on the p type region and the auxiliary n+ type region.

The gate electrode may overlap the p type region and the auxiliary n+ type region.

The semiconductor device according to an exemplary embodiment of the present disclosure may further include a p+ type region disposed under the lower surface of the trench and disposed in the p type region.

The p+ type region and the auxiliary n+ type region may be disposed adjacent to each other.

The auxiliary electrode may be in contact with the p+ type region.

A manufacturing method of a semiconductor device according to an exemplary embodiment of the present disclosure includes: sequentially forming an n− type layer and an n+ type region at a first surface of a substrate; etching the n-type layer and the n+ type region to form a trench; forming a p type region adjacent to a side surface of the trench and extending to a part of a lower surface of the trench; forming a gate insulating layer separated from the gate side surface at the lower surface of the trench; forming a gate electrode on the gate insulating layer; forming an insulating layer on the gate electrode; forming an auxiliary n+ type region in the p type region under the lower surface of the trench; forming a source electrode on the n+ type region; forming an auxiliary electrode at the lower surface of the trench and separated from the gate electrode; and forming a drain electrode at a second surface of the substrate, wherein the auxiliary electrode is in contact with the auxiliary n+ type region, and the source electrode is in contact with the n+ type region.

A semiconductor device according to an exemplary embodiment of the present disclosure includes an n− type layer disposed on a first surface of a substrate; an n+ type region disposed on the n− type layer; a trench disposed on the n− type layer; a p type region disposed adjacent to a side surface of the trench and extending to a part under the lower surface of the trench; an auxiliary n+ type region disposed under the lower surface of the trench and disposed in the p type region; an auxiliary electrode disposed on the lower surface of the trench; a gate trench disposed under the trench; a gate insulating layer disposed in the gate trench; a gate electrode disposed on the gate insulating layer and separated from the auxiliary electrode; a source electrode disposed on the n+ type region; and a drain electrode disposed on a second surface of the substrate, wherein the auxiliary electrode is in contact with the auxiliary n+ type region, and the source electrode is in contact with the n+ type region.

The auxiliary n+ type region and the p type region may be in contact with the side surface of the gate trench.

As above-described, according to an exemplary embodiment of the present disclosure, by disposed the auxiliary electrode separated from the gate electrode and the source electrode, when applying the voltage in a forward direction to the gate electrode, since the current path is formed between the drain electrode and the source electrode by the auxiliary electrode, the current density may be improved. As the current density is improved, the area of the semiconductor device for the same current amount may be reduced.

Also, since the gate electrode determining the on-off state of the semiconductor device is isolated by the gate insulating layer compared with the general JFET device, the current path is not formed in the gate electrode. A leakage current of the gate electrode may be reduced.

DETAILED DESCRIPTION OF THE EMBODIMENTS

Figure 1:
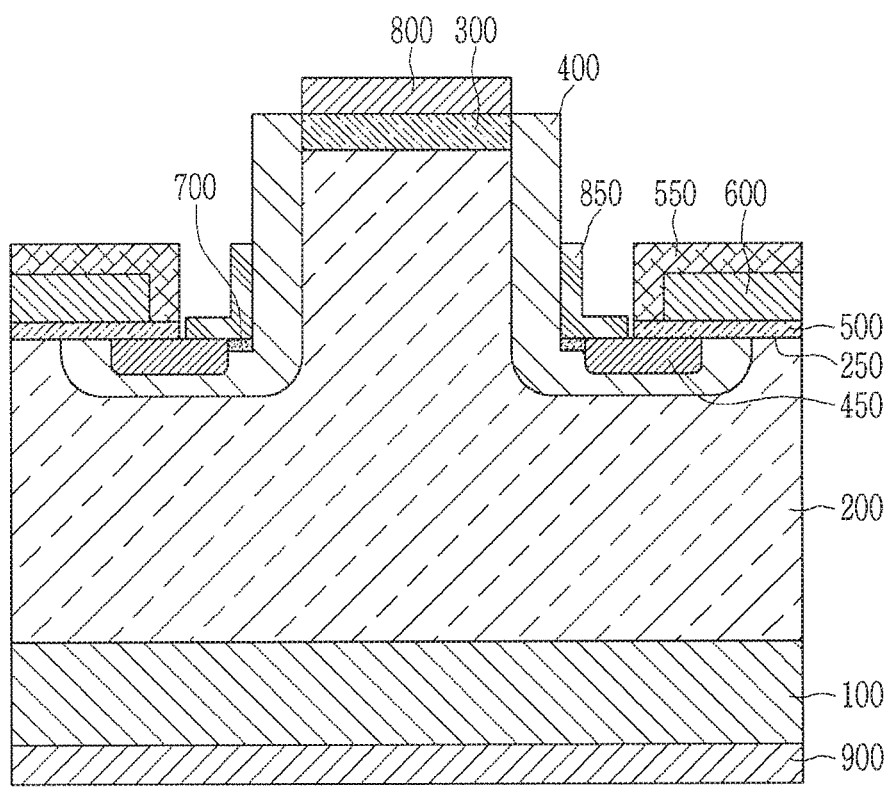
FIG. 1 is a cross sectional view schematically showing an example of a semiconductor device according to an exemplary embodiment of the present disclosure.

Hereinafter, exemplary embodiments of the present disclosure will be described in detail with reference to the accompanying drawings. As those skilled in the art would realize, the described embodiments may be modified in various different ways, all without departing from the spirit or scope of the present disclosure. On the contrary, exemplary embodiments introduced herein are provided to make disclosed contents thorough and complete and sufficiently transfer the spirit of the present disclosure to those skilled in the art.

In the drawings, the thickness of layers, films, panels, regions, etc., are exaggerated for clarity. Further, it will be understood that when a layer is referred to as being "on" another layer or substrate, it can be directly on the other layer or substrate, or intervening them may also be present.

FIG. 1 is a cross sectional view schematically showing an example of a semiconductor device according to an exemplary embodiment of the present disclosure.

Referring to FIG. 1, a semiconductor device according to an exemplary embodiment of the present disclosure includes a substrate 100, an n− type layer 200, an n+ type region 300, a p type region 400, an auxiliary n+ type region 450, a gate electrode 600, a p+ type region 700, a source electrode 800, an auxiliary electrode 850, and a drain electrode 900.

The substrate 100 may be an n+ type silicon carbide substrate.

The n− type layer 200 is disposed on the first surface of the substrate 100. The trench 250 is formed at the n− type layer 200. The n+ type region 300 is disposed at the upper surface of the n− type layer 200. The p type region 400 is disposed adjacent to the side surface of the trench 250 and extends till a part under the lower surface of the trench 250. The auxiliary n+ type region 450 and the p+ type region 700 are disposed under the lower surface of the trench 250 and are disposed in the p type region 400. The auxiliary n+ type region 450 and the p+ type region 700 are disposed to be adjacent to each other. The n+ type region 300 and the auxiliary n+ type region 450 are separated from each other.

The gate insulating layer 500 is disposed at the lower surface of the trench 250. The gate insulating layer 500 is disposed to be separated from the side surface of the trench 250 and is disposed on the p type region 400 and the auxiliary n+ type region 450. The gate electrode 600 is disposed on the gate insulating layer 500. The part of the gate electrode 600 overlaps the part of the p type region 400 and the part of the auxiliary n+ type region 450. The insulating layer 550 is disposed on the gate electrode 600. The insulating layer 550 covers the gate electrode 600. The gate electrode 600 and the insulating layer 550 are disposed to be separated from the side surface of the trench 250. The gate insulating layer 500 and the insulating layer 550 may include silicon oxide ($SiO_2$), and the gate electrode 600 may include a poly-crystalline silicone or a metal.

The auxiliary electrode 850 extends till the part of the lower surface of the trench 250 through the inside of the side surface of the trench 250. The auxiliary electrode 850 is separated from the gate insulating layer 500, the gate electrode 600, and the insulating layer 550. The auxiliary electrode 850 disposed at the lower surface of the trench 250 is in contact with the auxiliary n+ type region 450 and the p+ type region 700. The auxiliary electrode 850 disposed inside the side surface of the trench 250 is in contact with the p type region 400. The auxiliary electrode 850 is separated from the gate electrode 600, the source electrode 800, and the drain electrode 900. The auxiliary electrode 850 may include an ohmic metal. On the other hand, the auxiliary electrode 850 may be only disposed at the lower surface of the trench 250 to be in contact with the auxiliary n+ type region 450 and the p+ type region 700.

The source electrode 800 is disposed on the n+ type region 300 and is in contact with the n+ type region 300. The drain electrode 900 is disposed at the second surface of the substrate 100. Here, the source electrode 800 and the drain electrode 900 may include the ohmic metal. The second surface of the substrate 100 indicates a surface opposite to the first surface of the substrate 100.

Next, an operation of the semiconductor device according to an exemplary embodiment of the present disclosure will be described with reference to FIG. 2 to FIG. 4.

Figure 2:
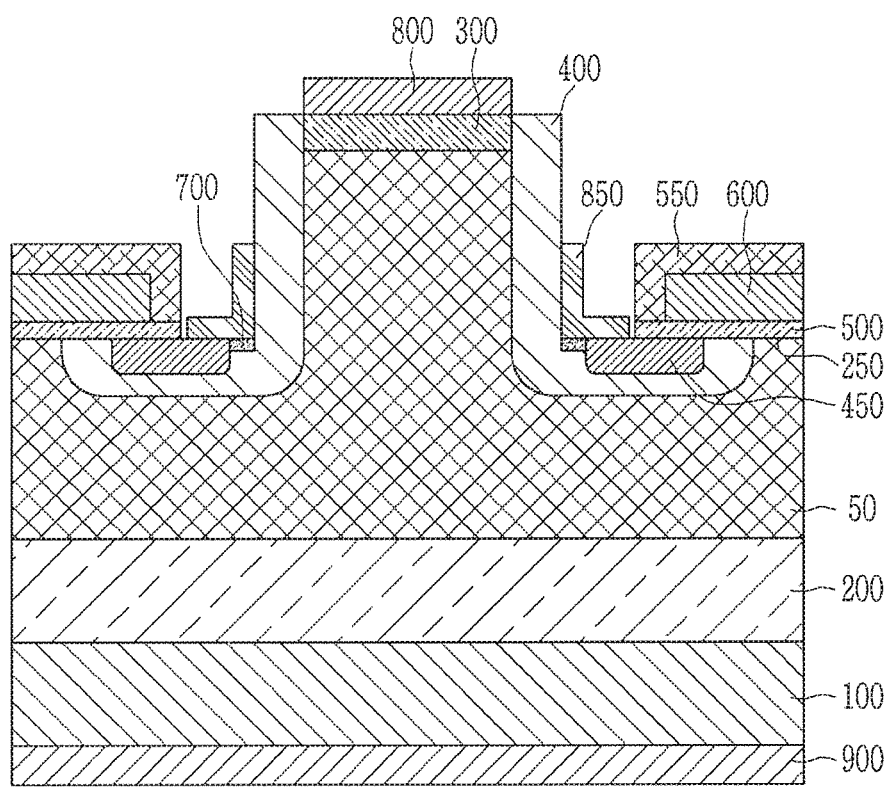
FIG. 2 to FIG. 4 are views schematically showing an operation of the semiconductor device shown in FIG. 1.
Figure 3:
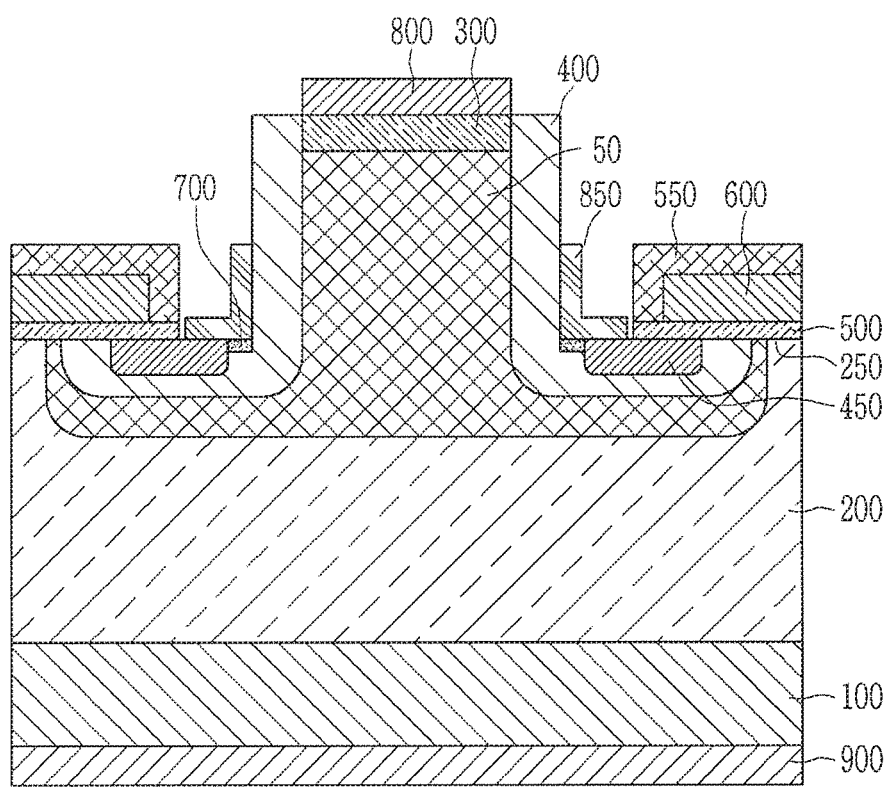
Figure 4:
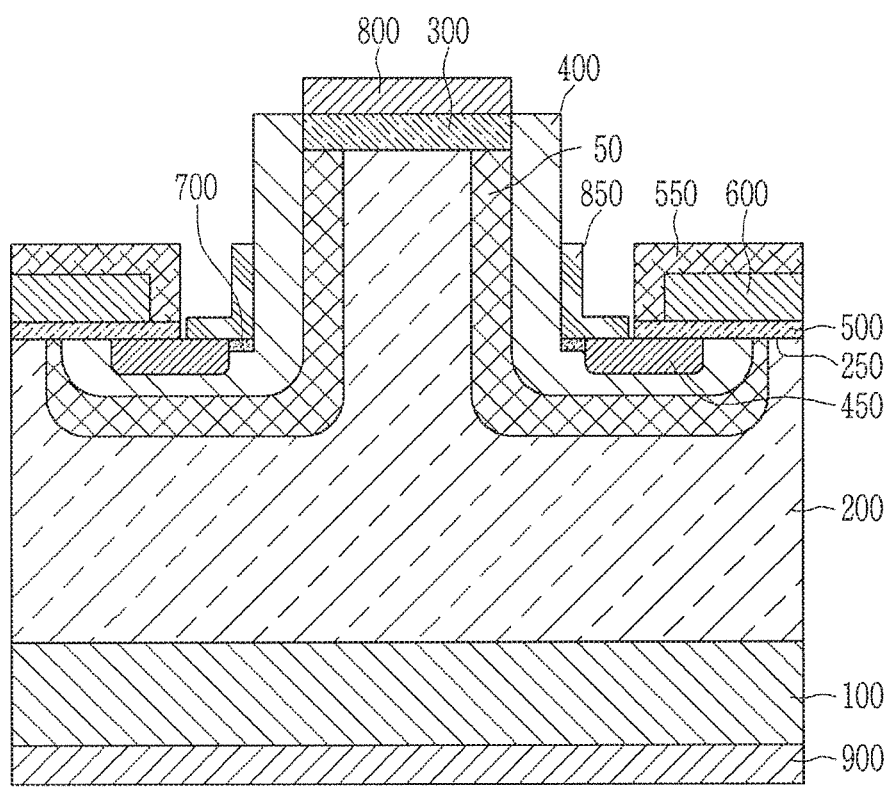

FIG. 2 to FIG. 4 are views schematically showing an operation of the semiconductor device shown in FIG. 1.

FIG. 2 is the view showing an off state of the semiconductor device shown in FIG. 1. FIG. 3 and FIG. 4 are the views showing an on state of the semiconductor device shown in FIG. 1. FIG. 3 is the view showing the operation state under a turn-on voltage of the semiconductor device shown in FIG. 1. FIG. 4 is the view showing the operation state above the turn-on voltage of the semiconductor device shown in FIG. 1. The operation of FIG. 3 and the operation of FIG. 4 are continuously performed.

The off state of the semiconductor device is performed in a condition below.

$$V_{GS} < V_{TH}, V_{DS} \geq 0V$$

The operation under the turn-on voltage of the semiconductor device is performed in a condition below.

$$V_{GS} \geq V_{TH}, V_{DS} < V_{turn-on}$$

The operation above the turn-on voltage of the semiconductor device is performed in a condition below.

$$V_{GS} \geq V_{TH}, V_{DS} > V_{turn-on}$$

Here, $V_{TH}$ is a threshold voltage, $V_{turn-on}$ is a turn-on voltage, $V_{GS}$ is $V_G - V_S$, and $V_{DS}$ is $V_D - V_S$. $V_G$ is a voltage applied to the gate electrode, $V_D$ is a voltage applied to the drain electrode, and $V_S$ is a voltage applied to the source electrode.

On the other hand, the voltage is not directly applied to the auxiliary electrode 850.

Referring to FIG. 2, during the off state of the semiconductor device, a depletion layer 50 is formed in the n− type layer 200 such that a flow of an electron and a current is not generated. The depletion layer 50 encloses the lower surface of the trench 250 and the p type region 400.

Referring to FIG. 3, during the operation below the turn-on voltage of the semiconductor device, the area of the depletion layer 50 is reduced compared with the off state of the semiconductor device. In this case, the part of the depletion layer 50 disposed under the gate electrode 600 is removed by the voltage applied to the gate electrode 600, accordingly, the channel is formed in the p type region 400 overlapping the gate electrode 600. The current is injected to the auxiliary n+ type region 450 through the channel, accordingly, the voltage is applied to the auxiliary n+ type region 450. In addition, the voltage is applied to the p type region 400 through the auxiliary electrode 850 that is in contact with the auxiliary n+ type region 450. This operation state is referred to as an on preparation state.

Referring to FIG. 4, during the operation above the turn-on voltage of the semiconductor device, as the voltage applied to the drain electrode 900 is increased, if the voltage applied to the auxiliary n+ type region 450 and the p type region 400 is increased, the depletion layer 50 is removed under the n+ type region 300, that is, the channel part such that the current path is formed between the source electrode 800 and the drain electrode 900. This operation state is referred to as the on state.

As above-described, in the semiconductor device according to an exemplary embodiment of the present disclosure, during the voltage application of the foreword direction, since the current path is formed between the drain electrode 900 and the source electrode 800 by the auxiliary electrode 850, the current density may be improved. As the current density is improved, the area of the semiconductor device for the same current amount may be reduced.

Without directly applying the voltage to the p type region 400, since the voltage is applied to the p type region 400 through the auxiliary electrode 850 in the on preparation state, the voltage applied to the p type region 400 may be not higher than the voltage applied to the n− type layer 200. As a result, the turn-on by a PN junction may be prevented. Since the gate electrode 600 is isolated by the gate insulating layer 500 compared with a general JEFT device, the current path is not formed in the gate electrode 600 such that the leakage current of the gate electrode 600 may be reduced.

Next, the characteristics of the semiconductor device according to the present disclosure and the semiconductor device according to a comparative example will be compared and described with reference to Table 1 and Table 2. The semiconductor device according to the comparative example is the general JFET device to which the auxiliary electrode according to the present disclosure is not applied.

Table 1 and Table 2 show a simulation result of the semiconductor device according to the present disclosure and the semiconductor device according to a comparative example.

In Table 1 and Table 2, the breakdown voltages of the semiconductor element according to the present disclosure and the semiconductor element according to the comparative example are made substantially equal, and the current densities are compared.

TABLE 1

|  | breakdown voltage (V) | threshold voltage(V) (@0.1 A/cm$^2$) | current density (A/cm$^2$) | | |
| --- | --- | --- | --- | --- | --- |
|  |  |  | @V$_{DS}$ = 2.5 V | @V$_{DS}$ = 5 V | @V$_{DS}$ = 10 V |
| Comparative Example | 637 | 1.9 | 60.268 | 75.63 | 95.7 |
| exemplary embodiment | 653 | 7.9 | 2.525 | 685.36 | 2010.6 |

TABLE 2

|  | gate electrode leakage current density [A/cm$^2$] (@V$_{DS}$ = 5 V, V$_{GS}$ = 2.5 V) | off state gate electrode leakage current density [A/cm$^2$] (@V$_{DS}$ = 600 V, V$_{GS}$ = 0 V) | on state gate electrode leakage current density [A/cm$^2$] (@V$_{DS}$ = 5 V) |
| --- | --- | --- | --- |
| Comparative Example | 2.40e−3 | 3.50e−4 | 1.202e−10 (V$_{GS}$ = 2.5 V) |
| exemplary embodiment | 5.83e−7 | 1.45e−6 | 9.191e−15 (V$_{GS}$ = 20 V) |

Referring to Table 1 and Table 2, it may be confirmed that the current density is increased in the semiconductor device according an exemplary embodiment of the present disclosure compared with the semiconductor device according to the comparative example.

In this case, it may be confirmed that the current density is increased above V$_{DS}$=2.5V by the channel turn-on voltage. In detail, in V$_{DS}$=5V, it may be confirmed that the current density is increased by 806% in the semiconductor device according to the present disclosure compared with the semiconductor device according to the comparative example.

In detail, in V$_{DS}$=10V, it may be confirmed that the current density is increased by 2001% in the semiconductor device according to the present disclosure compared with the semiconductor device according to the comparative example.

Depending on the increasing of the current density of the semiconductor device, a chip area of the semiconductor device may be reduced.

It may be confirmed that the gate electrode leakage current is described in the semiconductor device according to the present disclosure compared with the semiconductor device according to the comparative example. In detail, in the off state, it may be confirmed that the gate electrode leakage current of the semiconductor device according to the present disclosure is about 0.4% compared with the semiconductor device according to the comparative example.

In the off state, it may be confirmed that the gate electrode leakage current of the semiconductor device according to the present disclosure is about 0.008% compared with the semiconductor device according to the comparative example.

On the other hand, in the semiconductor device according to the comparative example as the general JFET device, the voltage applied to the gate electrode to prevent the PN junction turn-on is limited to about 2.5V to 3.0V.

However, in the semiconductor device according to the present disclosure, it is possible to apply to the gate electrode up to the voltage (about 30 V to 40 V) where the gate insulating layer is destroyed.

Next, a manufacturing method of a semiconductor device according to an exemplary embodiment of the present disclosure will be described with reference to FIG. 5 to FIG. 9 and FIG. 1.

FIG. 5 to FIG. 9 are cross sectional views schematically showing an example of a manufacturing method of a semiconductor device according to an exemplary embodiment of the present disclosure.

Figure 5:
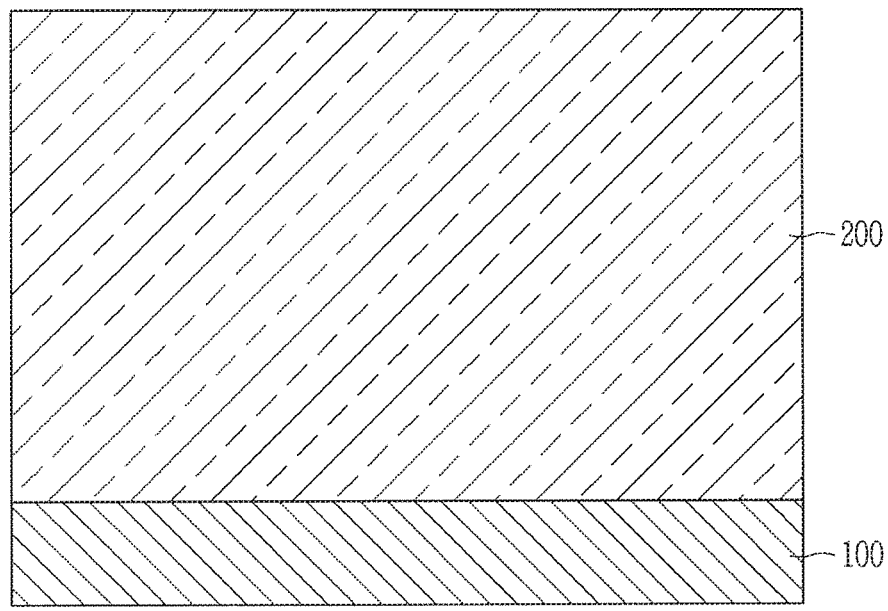
FIG. 5 to FIG. 9 are cross sectional views schematically showing an example of a manufacturing method of a semiconductor device according to an exemplary embodiment of the present disclosure.

Referring to FIG. 5, the substrate 100 is prepared, and the n− type layer 200 is formed at the first surface of the substrate 100. The n− type layer 200 may be formed by an epitaxial growth at the first surface of the substrate 100. Here, the substrate 100 may be the n+ type silicon carbide substrate.

Figure 6:
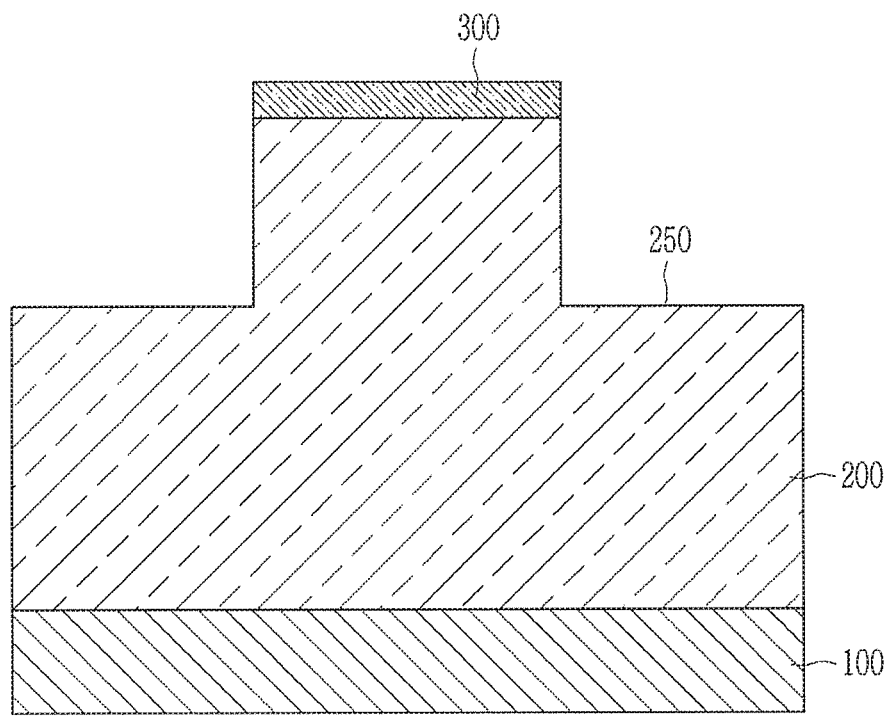

Referring to FIG. 6, the n+ type region 300 is formed on the n− type layer 200, and then the n− type layer 200 and the n+ type region 300 are etched to form the trench 250.

The n+ type region 300 may be formed by injecting a n type ion such as nitrogen (N), phosphorus (P), arsenic (As), and antimony (Sb) on the upper surface of the n− type layer 200. However, it is not limited thereto and the n+ type region 300 may be formed by the epitaxial growth on the n− type layer 200.

Figure 7:
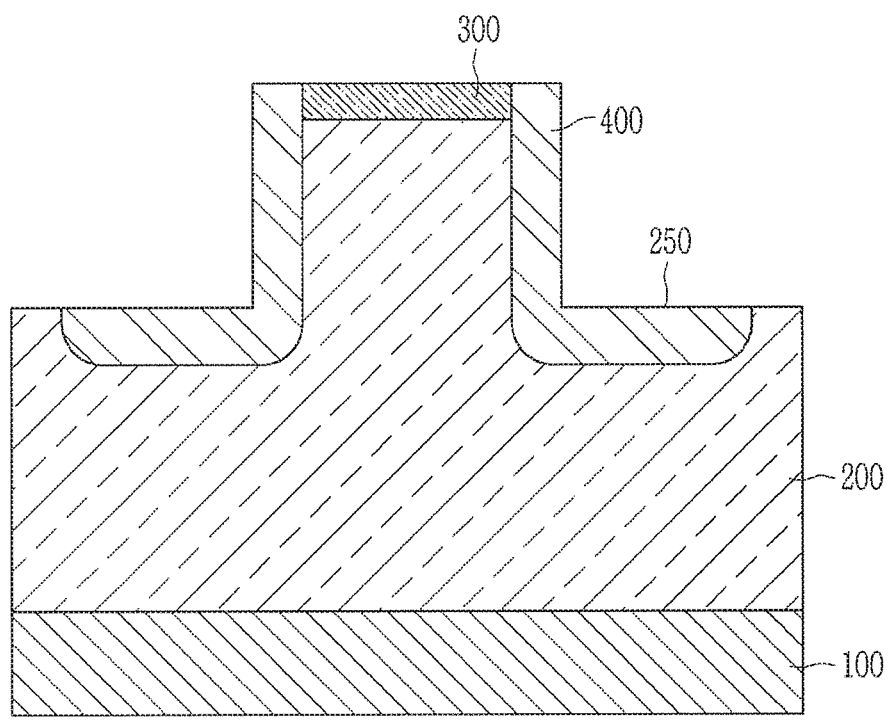

Referring to FIG. 7, the p type region 400 may be formed by injecting the p type ion such as boron (B), aluminum (Al), gallium (Ga), and indium (In) on the side surface and the lower surface of the trench 250. Thus, the p type region 400 is disposed adjacent to the side surface of the trench 250 and extends to the lower surface of the trench 250.

Figure 8:
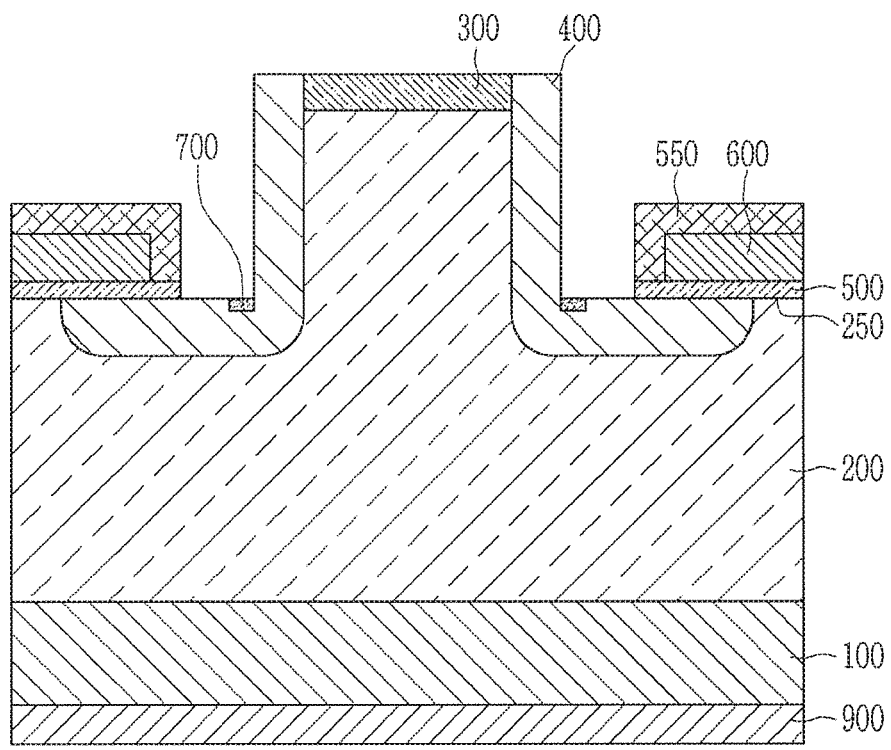

Referring to FIG. 8, after the gate insulating layer 500 is formed on the lower surface of the trench 250, the gate electrode 600 is formed on the gate insulating layer 500, and then the insulating layer 550 is formed on the gate electrode 600. The gate insulating layer 500, the gate electrode 600, and the insulating layer 550 are separated from the side surface of the trench 250.

The p+ type region 700 is formed on the upper surface of the p type region 400 between the gate insulating layer 500 and the side surface of the trench 250 by injecting the p type ion such as boron (B), aluminum (Al), gallium (Ga), and indium (In). That is, the p+ type region 700 is disposed under the lower surface of the trench 250 and is disposed in the p type region 400. Here, the ion doping concentration of the p+ type region 700 is higher than the ion doping concentration of the p type region 400.

In the present disclosure, after forming the gate insulating layer 500, the gate electrode 600, and the insulating layer 550, the p+ type region 700 is formed, however, it is not limited and the gate insulating layer 500, the gate electrode 600, and the insulating layer 550 may be formed after forming the p+ type region 700.

Figure 9:
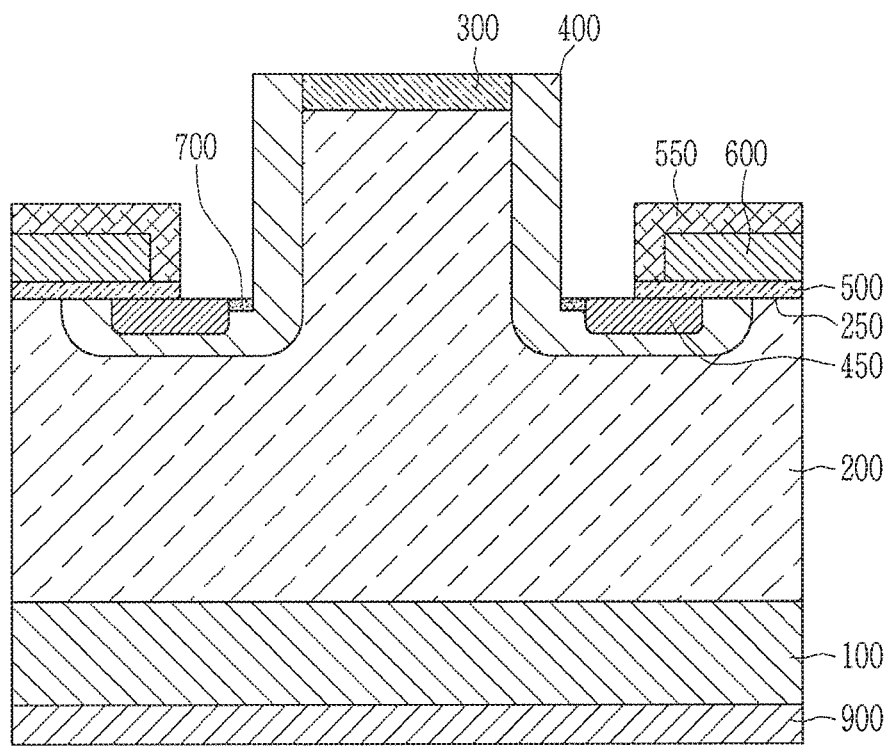

Referring to FIG. 9, the auxiliary n+ type region 450 is formed by injecting the by injecting the n type ion such as nitrogen (N), phosphorus (P), arsenic (As), and antimony (Sb) on the upper surface of the p type region 400 between the p+ type region 700 and the gate insulating layer 500. That is, the p+ type region 700 is disposed under the lower surface of the trench 250 and is disposed in the p type region 400. Here, the auxiliary n+ type region 450 extends to the lower part of the gate insulating layer 500 to overlap the gate electrode 600 and is disposed adjacent to the p+ type region 700.

Referring to FIG. 1, the source electrode 800 is formed on the n+ type region 300, the auxiliary electrode 850 is formed on the auxiliary n+ type region 450 and the p+ type region 700, and the drain electrode 900 is formed at the second surface of the substrate 100.

The auxiliary electrode 850 extends to the lower surface of the trench 250 through the inside of the side surface of the trench 250. The auxiliary electrode 850 is disposed at the lower surface of the trench 250 is in contact with the auxiliary n+ type region 450 and the p+ type region 700. The auxiliary electrode 850 disposed inside the side surface of the trench 250 is in contact with the p type region 400. On the other hand, the auxiliary electrode 850 may be only formed at the lower surface of the trench 250 to be in contact with the auxiliary n+ type region 450 and the p+ type region 700.

Next, the semiconductor device according to another exemplary embodiment of the present disclosure will be described with reference to FIG. 10.

Figure 10:
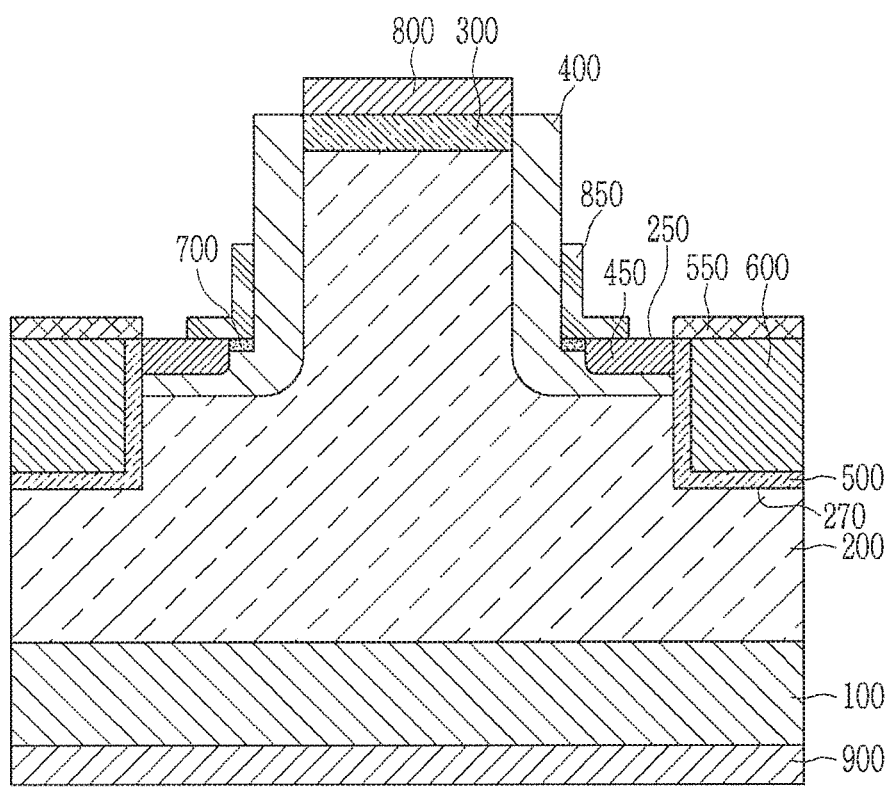
FIG. 10 is a cross sectional view schematically showing an example of a semiconductor device according to another exemplary embodiment of the present disclosure.

FIG. 10 is a cross sectional view schematically showing an example of a semiconductor device according to another exemplary embodiment of the present disclosure.

Referring to FIG. 10, for the semiconductor device according to the present disclosure, the rest structure except for the position of the gate insulating layer 500 and the gate electrode 600 is the same as the semiconductor device according to FIG. 1. Accordingly, the description for the same structure is omitted.

A gate trench 270 is disposed under the trench 250. The p type region 400 and the auxiliary n+ type region 450 are in contact with the side surface of the gate trench 270.

The gate insulating layer 500 is disposed in the gate trench 270, and the gate electrode 600 is disposed on the gate insulating layer 500. The gate electrode 600 is disposed to fill the gate trench 270. The insulating layer 550 is disposed on the gate electrode 600.

That is, for the semiconductor device according to the present disclosure compared with the semiconductor device of FIG. 1, the rest structure is the same except for the gate insulating layer 500 and the gate electrode 600 in the gate trench 270 disposed under the trench 250.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device comprising:
   an n− type layer disposed on a first surface of a substrate;
   an n+ type region that is disposed on the n− type layer and is in contact with the n− type layer;
   a trench disposed on the n− type layer;
   a p type region disposed adjacent to a side surface of the trench and extending to a part under a lower surface of the trench;
   an auxiliary n+ type region disposed under the lower surface of the trench and disposed in the p type region;
   an auxiliary electrode disposed on the lower surface of the trench;
   a gate electrode separated from the auxiliary electrode and disposed at the lower surface of the trench;
   a source electrode disposed on the n+ type region; and
   a drain electrode disposed at a second surface of the substrate,
   wherein the auxiliary electrode is in contact with the auxiliary n+ type region, and the source electrode is in contact with the n+ type region,
   wherein, in a preparation state of the semiconductor device, a channel that is a current path is formed in the p type region overlapping the gate electrode such that a voltage is applied to the auxiliary n+ type region through the channel and applied to the p type region through the auxiliary electrode'
   wherein the auxiliary electrode is disposed between the gate electrode and the source electrode' and
   wherein' in an on state of the semiconductor device' a current path is formed between the drain electrode and the source electrode by the auxiliary electrode.

2. The semiconductor device of claim 1, wherein the auxiliary electrode is separated from the source electrode and the drain electrode.

3. The semiconductor device of claim 2, wherein the auxiliary electrode is disposed in the side surface of the trench and is in contact with the p type region.

4. The semiconductor device of claim 3, further comprising a gate insulating layer disposed between the gate electrode and the lower surface of the trench,
   wherein the gate insulating layer is separated from the auxiliary electrode and is disposed on the p type region and the auxiliary n+ type region.

5. The semiconductor device of claim 4, wherein the gate electrode overlaps the p type region and the auxiliary n+ type region.

6. The semiconductor device of claim 1, further comprising a p+ type region disposed under the lower surface of the trench and disposed in the p type region.

7. The semiconductor device of claim 6, wherein the p+ type region and the auxiliary n+ type region are disposed adjacent to each other.

8. The semiconductor device of claim 7, wherein the auxiliary electrode is in contact with the p+ type region.

* * * * *